United States Patent [19]
Liang

[11] Patent Number: 5,776,817
[45] Date of Patent: Jul. 7, 1998

[54] METHOD OF FORMING A TRENCH STRUCTURE IN A SEMICONDUCTOR DEVICE

[75] Inventor: Kuei-Chang Liang, Taipei Hsien, Taiwan

[73] Assignee: Winbond Electronics Corporation, Taiwan

[21] Appl. No.: 779,155

[22] Filed: Jan. 3, 1997

[30]     Foreign Application Priority Data

Oct. 4, 1996  [TW]  Taiwan ................... 85112174

[51] Int. Cl.$^6$ .............................................. H01L 21/76
[52] U.S. Cl. ..................... 438/427; 438/424; 438/700; 438/705
[58] Field of Search ................................. 438/424, 427, 438/428, 700, 705

[56]         References Cited

U.S. PATENT DOCUMENTS 5,668,043   9/1997   Park .

*Primary Examiner*—George R. Fourson
*Attorney, Agent, or Firm*—Rabin & Champagne, P.C.

[57]         ABSTRACT

The invention relates to a method of forming trenches having different depths in a substrate of an IC using different refractory metal layers. The depths of the trenches can be changed by controlling the thicknesses of the refractory metal layers. The profiles of the trenches can be also changed by controlling operating parameters, such as temperature, reaction time, and so on. Thus, trenches having different depths are generated.

12 Claims, 6 Drawing Sheets

METHOD OF FORMING A TRENCH STRUCTURE IN A SEMICONDUCTOR DEVICE

BACKGROUND OF THE INVENTION

1. Field of the Invention

The present invention relates generally to a method of forming a trench structure in an integrated circuit (IC). More particularly, the present invention relates to a method of forming trenches having different depths in a substrate using different refractory metal layers which cover the substrate.

2. Technical Background

Trench structures are widely used for isolation purposes in the manufacture of ICs. For example, trench structures may be used as isolators in dynamic random access memory (DRAM) cells, thus replacing conventional local oxidation arrangements, so as to reduce the size of the IC. Furthermore, trench structures can be used as storage capacitors in the DRAM cell.

It is inevitable that trench structures will continue to be used for isolation purposes, and for storage capacitors, due to technical developments in the manufacturing of submicron ICs. Depending on the purpose of the devices, the depths of trenches may vary. The known method of forming trench structures for isolation purposes is described hereinafter by referring to FIG. 1A–FIG. 1F.

(A) Referring to FIG. 1A, a buffer oxide layer 101 and a silicon nitride layer 102 are sequentially formed over a silicon substrate 100.

(B) Referring to FIG. 1B, a photoresist layer 103 is coated on the silicon nitride layer 102, and then active and non-active regions are defined on the substrate 100 using photolithography. Next, a plurality of trenches 104 are formed by etching the non-active regions.

(C) Referring to FIG. 1C, the photoresist layer 103 is removed, and then a oxidation layer 105 is formed, which fills trenches 104.

(D) Referring to FIG. 1D, the substrate 100 is planarized, using for example, a chemical mechanical polishing (CMP) procedure, with the silicon nitride layer 102 serving as a polishing end point.

(E) Referring to FIG. 1E, the silicon nitride layer 102 is removed, and then a plurality of wells, for example p-type wells 106 and n-type wells 107, are formed in substrate 100.

(F) Referring to FIG. 1F, the buffer oxide layer 101 is removed, and then the surface of the substrate 100 is planarized. The filled trenches 104 (i.e., the trench structures) are thus formed in the substrate 100. Next, gates and source/drain regions, for example a gate region 108 and source/drain regions 109, are formed on the active regions using conventional methods.

According to the conventional technique, a chlorine-based gas mixture, such as $Cl_2/O_2/SiCl_4$ or $CBrF_3N_2$, is used in a triode-type dry-etch reactor to form the trenches. Because of the following, i.e.: a) changes in temperature; b) damage caused by the plasma ions; and c) the presence of polymer residues which inhibit reactions, the sidewall profiles and depths of the trenches do not meet the ideal requirements.

SUMMARY OF THE INVENTION

It is therefore an object of the present invention to provide a method of forming a trench structure in an integrated circuit. More particularly, the invention provides a method of forming trenches having different depths in a substrate, using a silicide fabricating process, wherein the depths depend on the thickness of the refractory metal layers which cover the substrate.

This is accomplished, in accordance with the present invention. An isolation layer is formed on a silicon substrate. First openings and second openings are formed in the isolation layer and positioned at predetermined locations. A first refractory metal layer is formed on the isolation layer, wherein the first refractory metal layer fills the first openings and the second openings. Portions of the first refractory metal layer are removed so as to expose the second openings. A second refractory metal layer is formed on the first refractory metal layer, and over the exposed second openings to fill the exposed second openings. Nitrogen gas is then supplied to form a first silicide layer and a second silicide layer in the substrate below the first openings and the second openings, respectively. The first refractory metal layer and the second refractory metal layer, and the first silicide layer and the second silicide layer are removed to form first trenches and second trenches, whereby the first trenches and the second trenches have different depths.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE PREFERRED EMBODIMENT

The present invention provides a method of forming a trench structure in an IC device. More particularly, the invention provides a method of forming trenches having different depths, in a substrate using a silicide fabricating process, and in dependence on the thickness of refractory metal layers that cover the substrate.

Figure 1A:
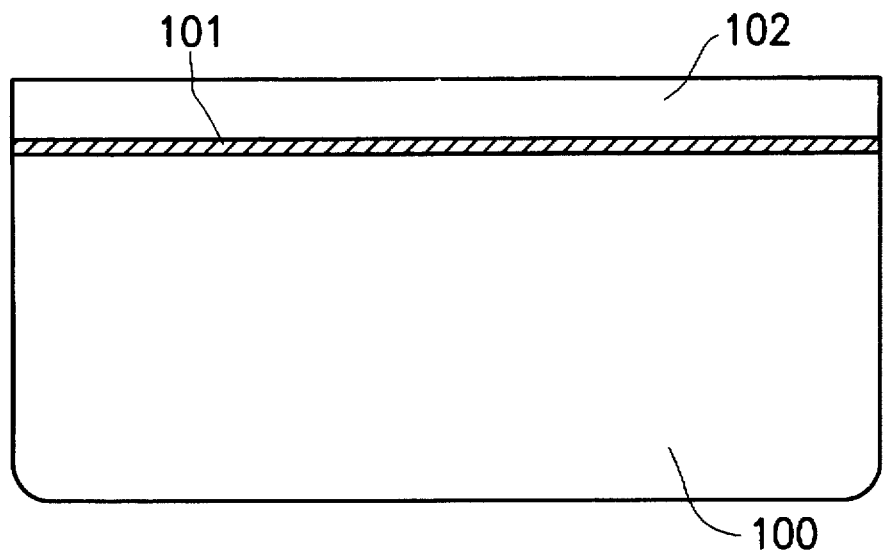
FIGS. 1A–1F are cross-sectional views of a substrate showing various sequential steps of a conventional method of forming isolation trenches.
Figure 1B:
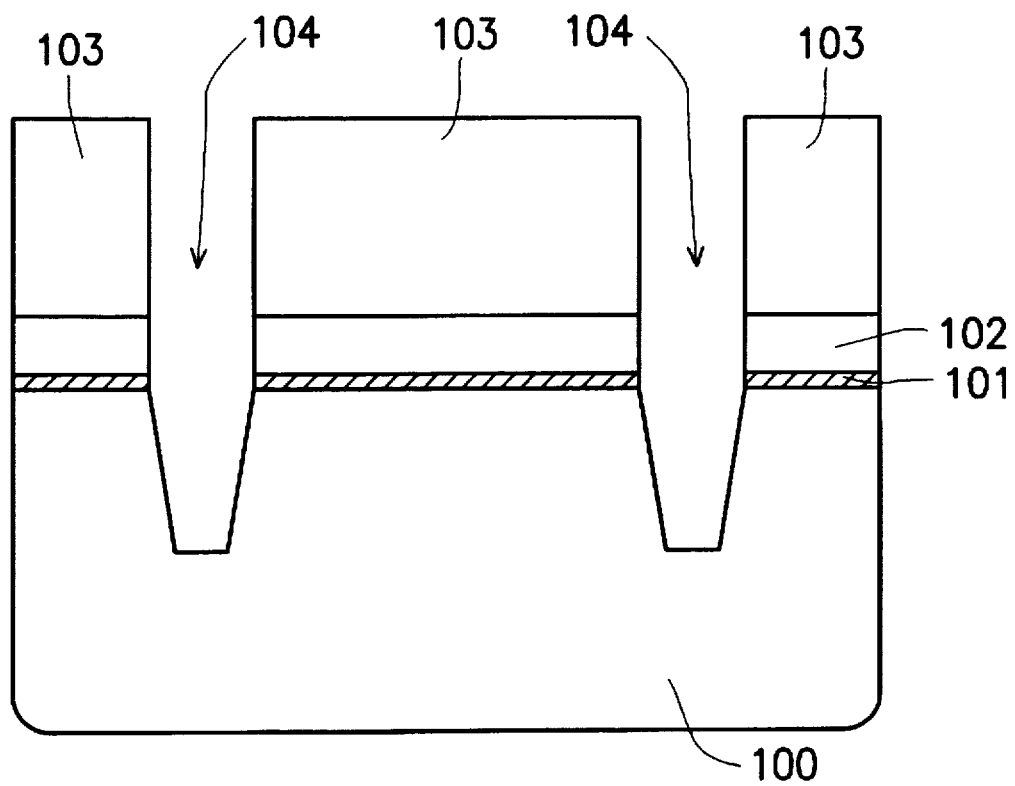
Figure 1C:
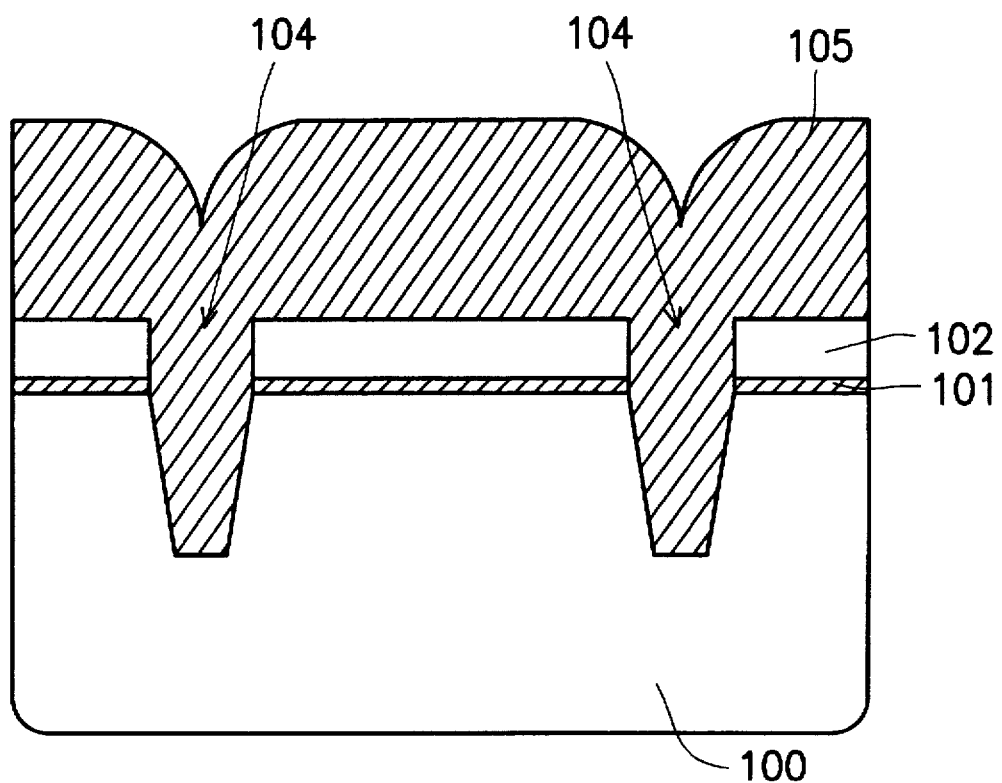
Figure 1D:
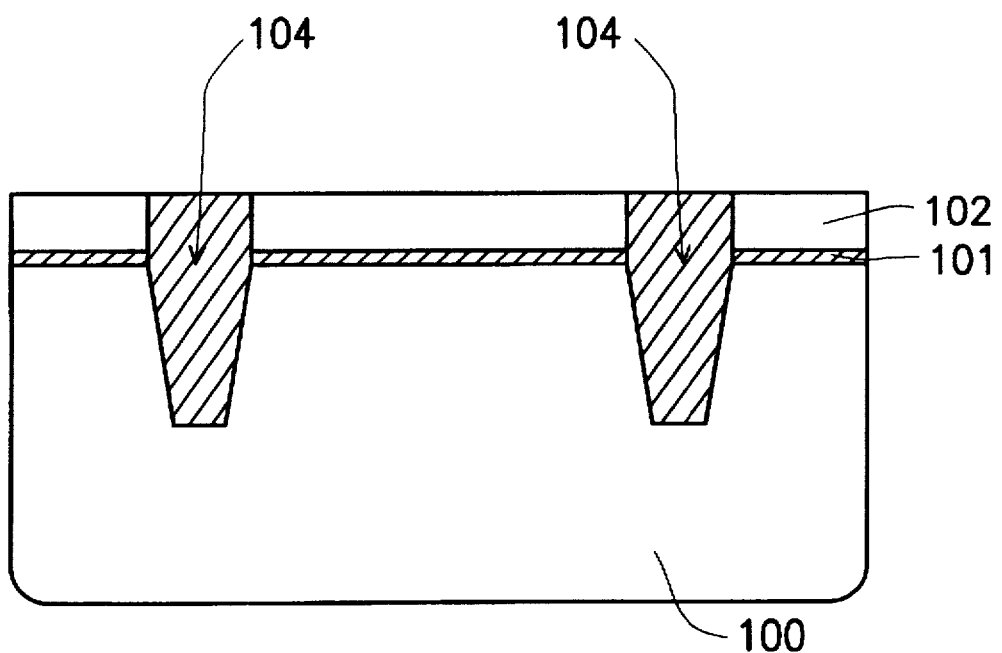
Figure 1E:
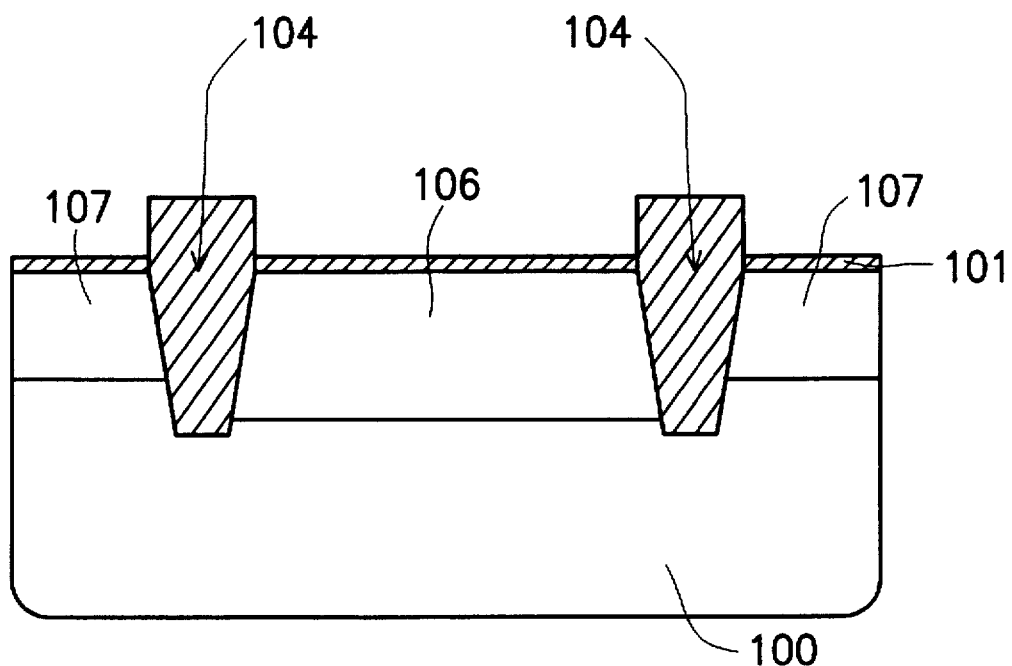
Figure 1F:
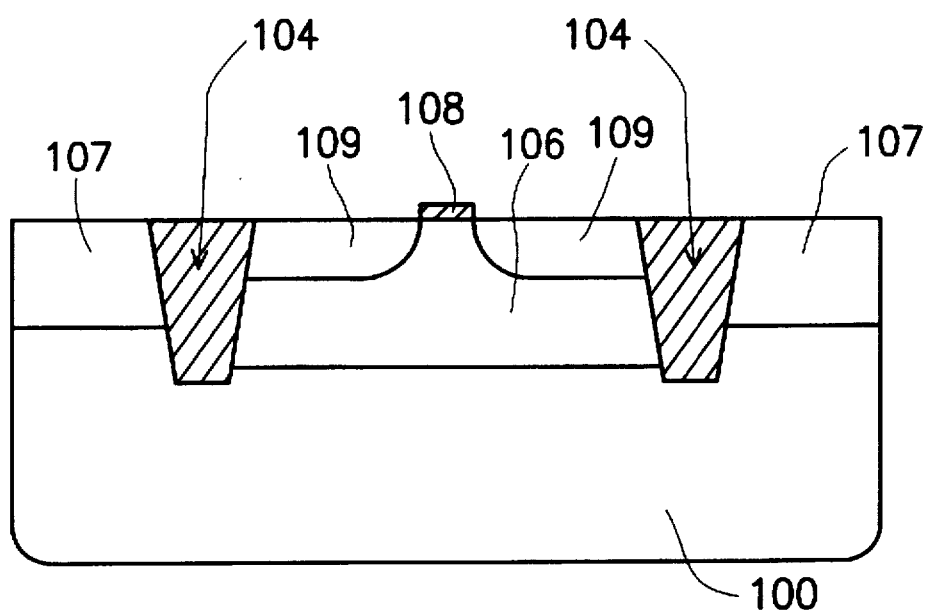
Figure 2A:
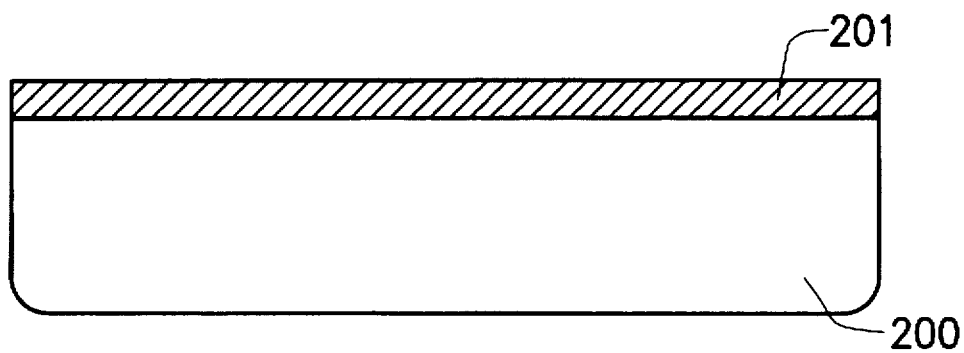
FIGS. 2A–2I are cross-sectional views of a substrate showing various sequential steps of a method of forming trench structures having different depths, in accordance with a preferred embodiment of the invention.

Referring to FIGS. 2A–2I, different cross-sectional views of a substrate are shown, in which trench structures having various depths are formed in accordance with the present invention. Referring to FIG. 2A, an isolation layer 201 is formed on a substrate 200. The isolation layer 201 is, for example, an oxidation layer which is formed using a wet oxidation process, and at a temperature in the range between about 800° C. to 1150° C. The isolation layer 201 has a thickness between about 0.01 µm to about 5 µm.

Figure 2B:
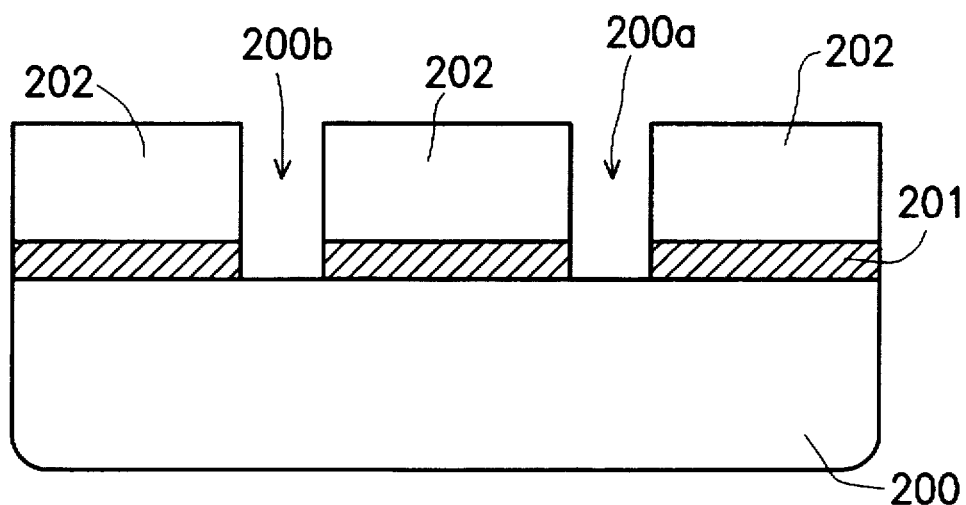

Next, referring to FIG. 2B, a photoresist layer 202 is coated on the isolation layer 201. Active and inactive regions are defined on the isolation layer 201. Using photolithography and etching techniques, a plurality of first openings 200a and a plurality of second openings 200b are formed in the active regions. The etching is performed using an anisotropic etching process, with for example, fluorocarbon plasma.

Figure 2C:
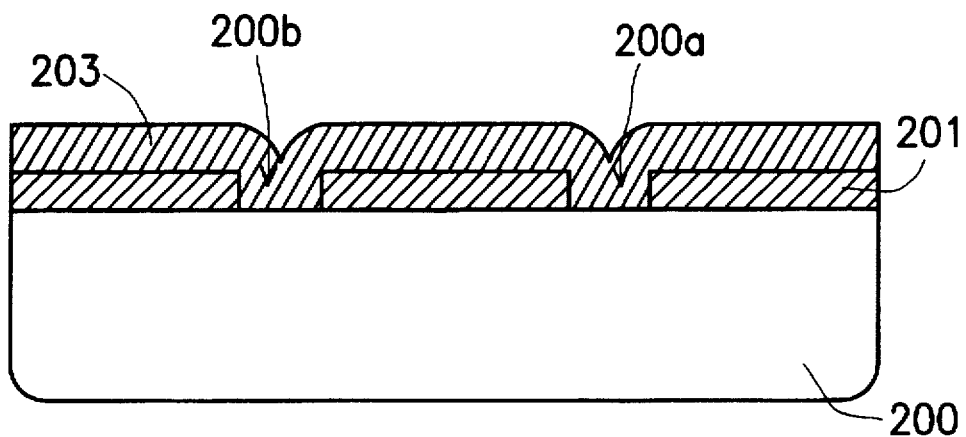

Referring to FIG. 2C, the photoresist layer 202 is removed, and a refractory metal layer 203 is formed over exposed regions of the substrate 200 and the isolation layer 201, thus filling the openings 200a and openings 200b. The above-mentioned refractory metal layer 203 can be formed, for example, using a physical vapor deposition (PVD) method at a sputtering temperature in the range between 150° C. to 350° C. The thickness of the refractory metal layer 203 depends on the demands of the device, and is generally in the range of 2,000 Å to 20,000 Å.

Figure 2D:
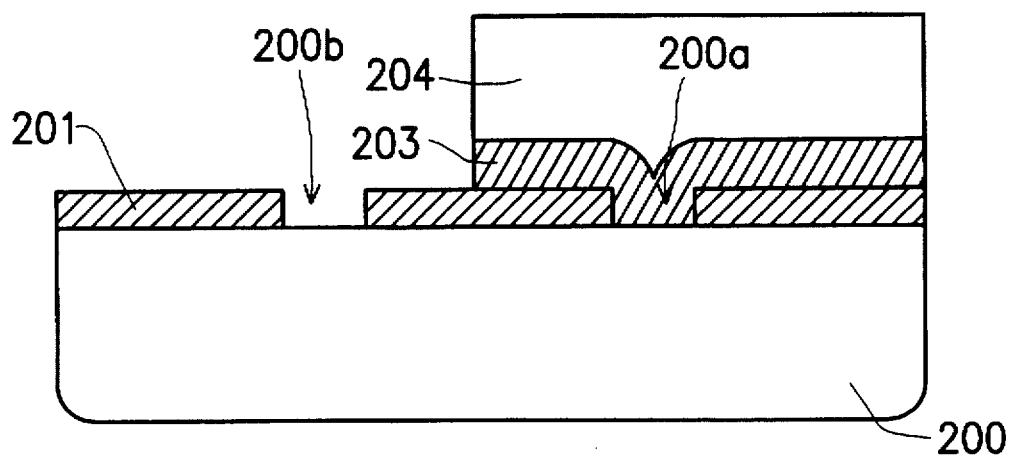

Next, and referring to FIG. 2D, the refractory metal layer 203 is coated with a photoresist layer 204, and is then patterned using photolithography and etching techniques. Portions of the patterned refractory metal layer 203 are retained so that deeper trenches can be formed. The other portions of the refractory metal layer 203 are removed, so that shallower trenches can be formed. For example, in this embodiment the opening 200a, which is covered by the refractory metal layer 203, will be associated with a deeper trench. The exposed opening 200b will be associated with a shallower trench. The etching can be performed, for example, with an anisotropic etching process using fluorocarbon plasma.

Figure 2E:
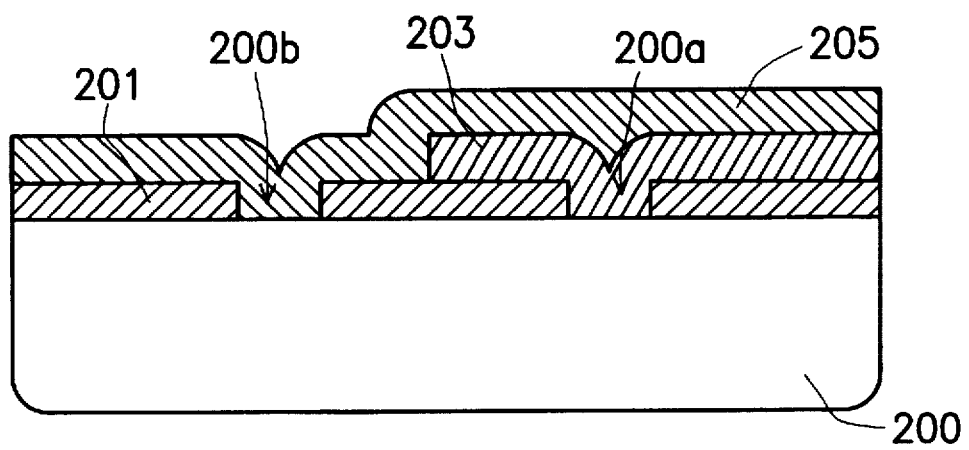

Next, and referring to FIG. 2E, the photoresist layer 204 is removed and a refractory metal layer 205 is formed over the substrate 200, using for example, a PVD method and at a sputtering temperature in the range between about 150° C. and about 350° C. The thickness of the refractory metal layer 205 is such that the opening 200b is filled. Normally, the thickness of the refractory metal layer 205 depends on the requirements of the various devices and in this embodiment, is in the range of 2,000 Å to 20,000 Å.

Figure 2F:
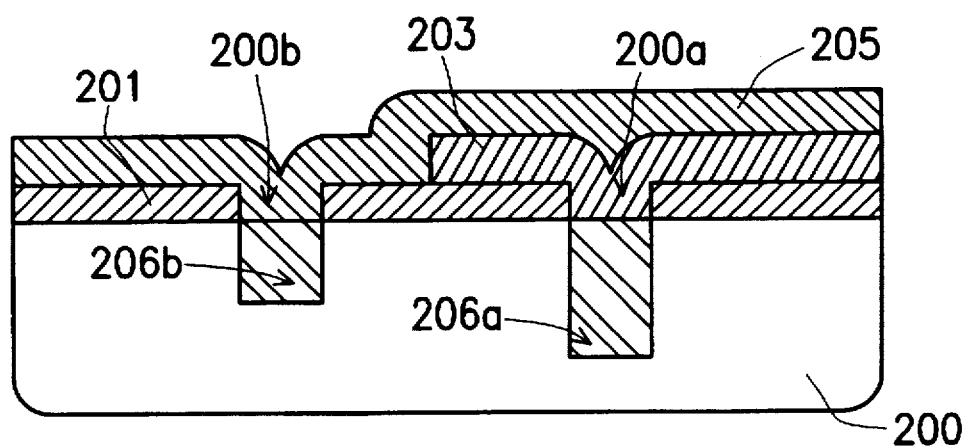

Referring to FIG. 2F, a silicide fabricating process is performed, such as a rapid thermal anneal (RTA) process. Using nitrogen gas, the surface of the substrate 200 is caused to react with contacting surfaces of the refractory metal layers 203 and 205. Silicide layers 206a and 206b are thus formed beneath the refractory metal layers 203 and 205, respectively, wherein the thickness of the silicide layer is determined based on the thickness of the refractory metal layer. As shown in FIG. 2F, the silicide layer 206b is shallower than the silicide layer 206a, because the thickness of the refractory metal layer above the opening 200b is less than that of the refractory metal layers above the opening 200a. The above-mentioned RTA process is performed at a temperature in the range of about 600° C. to 1150° C. The annealing time of the process is in the range of 30 seconds to 300 seconds. According to experimental results, a refractory metal layer having a 1 Å thickness can dissipate the substrate to a depth of about 2.6 Å.

Figure 2G:
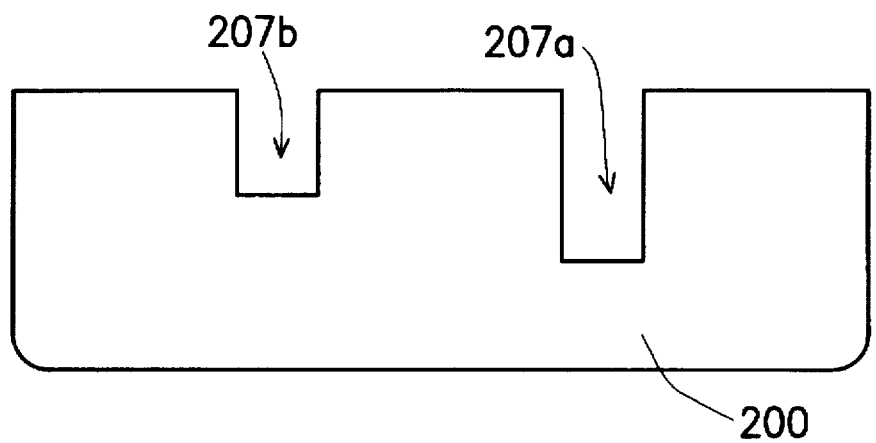

Next, and referring to FIG. 2G, the refractory metal layers 203 and 205, isolation layer 201, and silicide layers 206a and 206b are removed to form trenches 207a and 207b in the prior locations of silicide layers 206a and 206b. The removal is performed using, for example, a wet etching technique, using mixing solvents with $H_2SO_4$, $H_2O_2$ and HF-based chemical solutions.

Figure 2H:
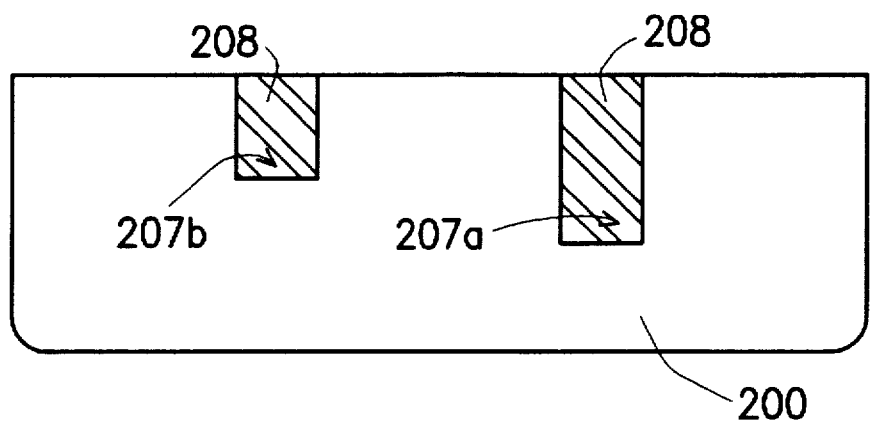

Referring to FIG. 2H, an isolation layer, such as an oxide layer 208, is formed, using a CVD (chemical vapor deposition) technique, over the substrate 200 to fill the trenches 207a and 207b. Next, the substrate 200 is polished to planarize the substrate using, for instance, CMP (chemical-mechanical polishing) techniques.

Figure 2I:
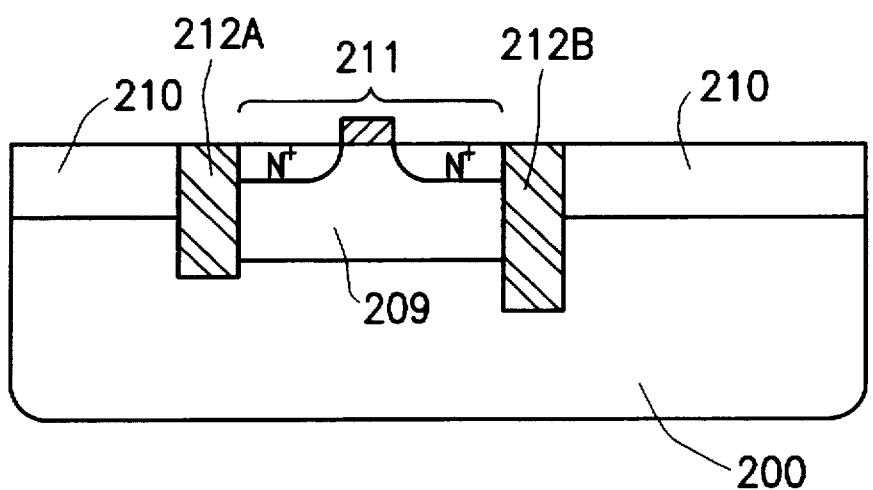

Referring to FIG. 2I, and as in the conventional process, p-type wells 209 and n-type wells 210 are formed on the substrate 200, using for example an ion implant method. An n-type MOS device 211 is formed on the p-type well 209 using conventional methods. The trenches of different depth, for example, 212A and 212B are formed by using a technique of this embodiment according to different needs of devices.

As shown in FIG. 2A to FIG. 2I, according to the present invention, the substrate 200 is gradually dissipated by reacting the substrate with the refractory metal layers 203 and 205. The depth of the dissipated portions of the substrate 200 can be changed by controlling the thicknesses of the refractory metal layers. The profiles of the trenches can be also changed by controlling various operating parameters, such as temperature, reaction time, and so on. After the silicide is formed, the refractory metal layers are selectively etched using etching solvents. The other residual portions of the substrate 200, for example, the silicide and isolation layer, can be removed by reacting the layers with solvents using wet etching. Thus, trenches having different depths are generated.

The depths and uniformity of the trenches depends on various parameters, such as temperature, reaction time, and the thickness of the refractory metal layers. The depths of the trenches can be selected based on the different needs. The depth of the trench is normally in the range of about 0.05 μm to 5 μm. One skilled in the related art can easily change the parameters according to actual needs.

In conclusion, the features of this invention include the following:

A) The depths of the trenches can be easily controlled. Since a refractory metal layer having a 1 Å thickness can dissipate the substrate to a depth of about 2.6 Å, the depths of the trenches can be selected by changing the thickness of the refractory metal layers.

B) Since the formation of the silicide is due to an anisotropic diffusion reaction, the profile and uniformity of the trenches can be enhanced.

C) Because the active regions and regions of the trenches are all located in the same layer, an ideal surface is provided for performing photolithography. Thus, the important elements in the MOS devices are better formed.

D) In the process of forming the trenches, special gases and manufacturing equipment are not needed. Therefore, the manufacturing cost is reduced.

While the invention has been described by way of example and in terms of a preferred embodiment, it is to be understood that the invention is not limited to the disclosed embodiment. To the contrary, it is intended to cover various modifications and similar arrangements. Therefore, the scope of the appended claims should be accorded the broadest interpretation so as to encompass all such modifications and similar arrangements.

What is claimed is:

1. A method of forming trenches on a semiconductor device, comprising:

(a) forming an isolation layer on a silicon substrate;

(b) patterning the isolation layer to form at least one first opening and at least one second opening at predetermined locations in the isolation layer;

(c) forming a first refractory metal layer over the isolation layer and filling the first opening and the second opening;

(d) removing a portion of the first refractory metal layer to expose the second opening;

(e) forming a second refractory metal layer over the first refractory metal layer, and over the exposed second opening to fill the exposed second opening;

(f) supplying nitrogen gas to form a first silicide layer and a second silicide layer in the substrate below the first opening and the second opening, respectively; and (g) removing the first refractory metal layer, the second refractory metal layer, the first silicide layer and the second silicide layer to form at least one first trench and at least one second trench, the first trench having a depth that is different than a depth of the second trench.

2. The method as claimed in claim 1, wherein the isolation layer comprises an oxide.

3. The method as claimed in claim 1, wherein the supplying nitrogen gas includes performing a rapid thermal annealing process.

4. The method as claimed in claim 3, wherein the rapid thermal annealing process is performed at a temperature in a range between about 600° C. to about 1150° C., and for a period of time in a range of about 30 seconds to about 300 seconds.

5. The method as claimed in claim 1, wherein the removing the first refractory metal layer, the second refractory metal layer, the first silicide layer and the second silicide layer is performed using wet etching.

6. The method as claimed in claim 5, wherein the wet etching uses chemical mixing solvents with $H_2SO_4$, $H_2O_2$ and HF-based solutions.

7. The method as claimed in claim 1, wherein the forming a first refractory metal layer and the forming a second refractory metal layer comprises performing sputtering using physical vapor deposition.

8. The method as claimed in claim 7, wherein the sputtering is performed at a temperature in a range from about 150° C. to about 350° C.

9. The method as claimed in claim 7, wherein a thickness of the first refractory metal layer and the second refractory metal layer are in a range from about 2,000 Å to about 20,000 Å.

10. The method as claimed in claim 1, wherein a depth of the first trench is greater than a depth of the second trench.

11. The method as claimed in claim 10, wherein the depths of the first trench and the second trench are in a range from about 0.05 μm to about 5 μm.

12. The method as claimed in claim 1, wherein the at least one first opening comprises a plurality of first openings, the at least one second opening comprises a plurality of second openings, the at least one first trench comprises a plurality of first trenches, and the at least one second trench comprises a plurality of second trenches.

* * * * *